(12) United States Patent
Li et al.

(10) Patent No.: US 7,663,882 B2
(45) Date of Patent: Feb. 16, 2010

(54) HEAT DISSIPATING ASSEMBLY HAVING A FAN DUCT

(75) Inventors: Hao Li, Shenzhen (CN); Tao Li, Shenzhen (CN); Jun Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 141 days.

(21) Appl. No.: 11/959,272

(22) Filed: Dec. 18, 2007

(65) Prior Publication Data

US 2009/0154099 A1 Jun. 18, 2009

(51) Int. Cl.
*H05K 7/20* (2006.01)

(52) U.S. Cl. ............ 361/697; 361/703; 165/80.3; 165/104.33; 257/E23.099

(58) Field of Classification Search .......... 361/692, 361/695, 697, 700, 703, 704, 706, 719
See application file for complete search history.

(56) References Cited

U.S. PATENT DOCUMENTS

| | | | |
|---|---|---|---|
| 7,038,911 B2 * | 5/2006 | Foster et al. ............ | 361/695 |
| 7,215,548 B1 * | 5/2007 | Wu et al. ............... | 361/703 |
| 7,243,708 B2 * | 7/2007 | Lee et al. .............. | 165/104.33 |
| 7,277,281 B1 * | 10/2007 | Lu et al. ............... | 361/695 |
| 7,349,212 B2 * | 3/2008 | Xia et al. .............. | 361/697 |
| 7,532,468 B2 * | 5/2009 | Sun et al. .............. | 361/690 |
| 2002/0063328 A1 * | 5/2002 | Baek et al. ............. | 257/706 |

* cited by examiner

*Primary Examiner*—Jayprakash N Gandhi
*Assistant Examiner*—Courtney Smith
(74) *Attorney, Agent, or Firm*—Frank R. Niranjan

(57) ABSTRACT

A heat dissipating assembly for dissipating heat from a graphic card and a hard disk driver (30), includes a heat sink (10) for contacting the graphic card and a fan duct (20) fixed on the heat sink. The fan duct is made by bending a planar metal plate and has a first portion soldered to a top face of the heat sink and a second portion slantwise and upwardly extending from the first portion. When a fan (40) generates an airflow towards the heat sink, a part of the airflow flows through the heat sink to remove heat in the heat sink, and another part of the airflow is guided slantwise and upwardly by the second portion of the fan duct to flow through the hard disk driver, thereby to cool the hard driver.

11 Claims, 3 Drawing Sheets

HEAT DISSIPATING ASSEMBLY HAVING A FAN DUCT

BACKGROUND OF THE INVENTION

1. Field of the Invention

The present invention relates to a heat dissipating assembly, and more particularly to a heat dissipating assembly incorporating a fan duct for guiding an airflow generated by a fan to cool an electronic device located above the fan duct.

2. Description of Related Art

The graphic card mounted on the motherboard in a computer produces much heat in operation. The heat must be quickly carried away from the graphic card since excessively high temperature will cause the graphic card to work abnormally. In additional to the graphic card, a hard disk driver located above the graphic card is also a heat source that needs to be cooled.

Typically, a related heat sink is mounted on the graphic card to remove heat therefrom. In order to enhance a heat dissipating efficiency of the heat sink, a fan is often mounted near the heat sink to provide forced airflow to the heat sink. However, the airflow engendered by the fan only flows through the graphic card to cool the graphic card, and cannot reach another electronic device such as a hard disk driver that is located above the graphic card, because the airflow is not guided to flow through the another electronic device. Therefore, the heat accumulating on the hard disk driver will cause the hard disk driver to overheat or even fail.

What is needed, therefore, is a heat dissipating device which can overcome the above-mentioned disadvantages.

SUMMARY OF THE INVENTION

A heat dissipating assembly for simultaneously dissipating heat from a graphic card and a hard disk driver, includes a heat sink for contacting the graphic card and a fan duct fixed on the heat sink. The fan duct is made by bending a planar metal plate into a folded configuration. When a fan near the heat sink operates to produce an airflow towards the heat sink, a part of the airflow flows through the heat sink to remove heat in the heat sink from the graphic card to cool the graphic card, another part of the airflow is guided slantwise and upwardly by the fan duct to flow through the hard disk driver, thereby to cool the hard disk driver.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
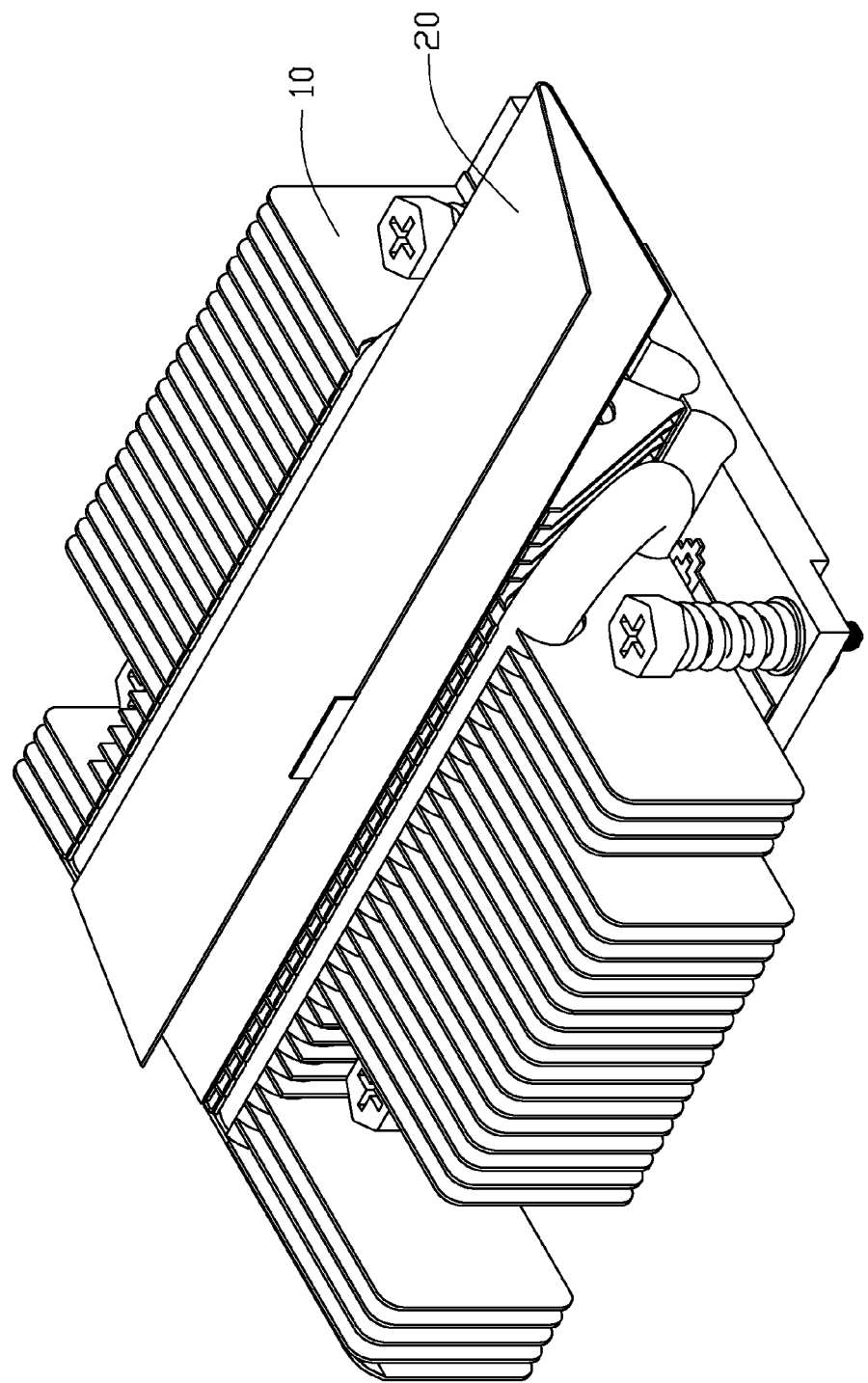
FIG. 1 is an assembled, isometric view of a heat dissipating assembly in accordance with a preferred embodiment of the present invention.
Figure 3:
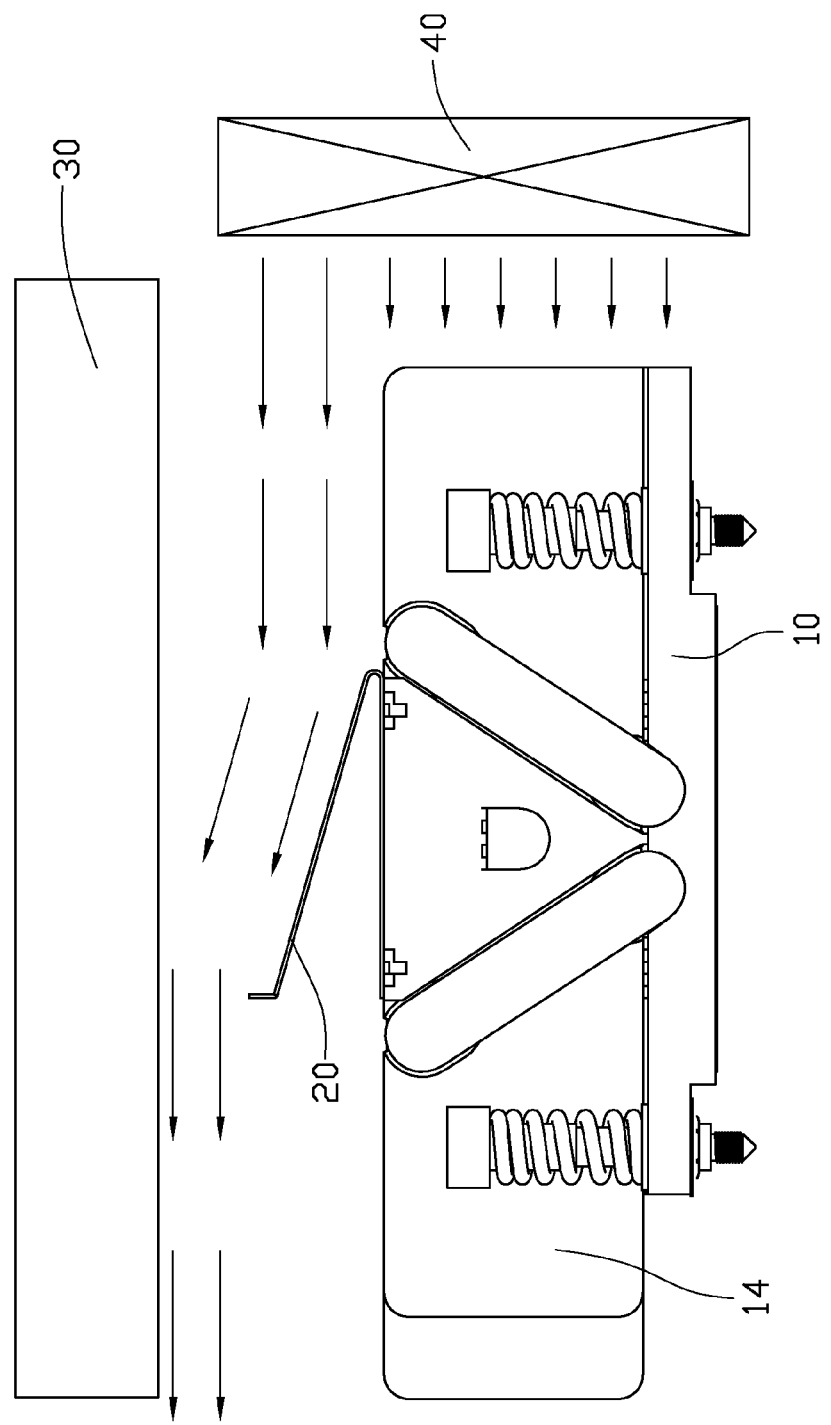
FIG. 3 is a side view of FIG. 1 with an airflow produced by a fan located at a side of the heat dissipating assembly and a hard disk driver located above the heat dissipating assembly.

Referring to FIGS. 1 and 3, a heat dissipating assembly in accordance with a preferred embodiment of the present invention comprises a heat sink 10 mounted on a graphic card (not shown), and a fan duct 20 fixed on the heat sink 10. A hard disk driver 30 is located above the graphic card. A fan 40 is located at a side of the heat sink 10 with its airflow outlet oriented towards the heat sink 10 for generating an airflow through the heat dissipating assembly.

Figure 2:
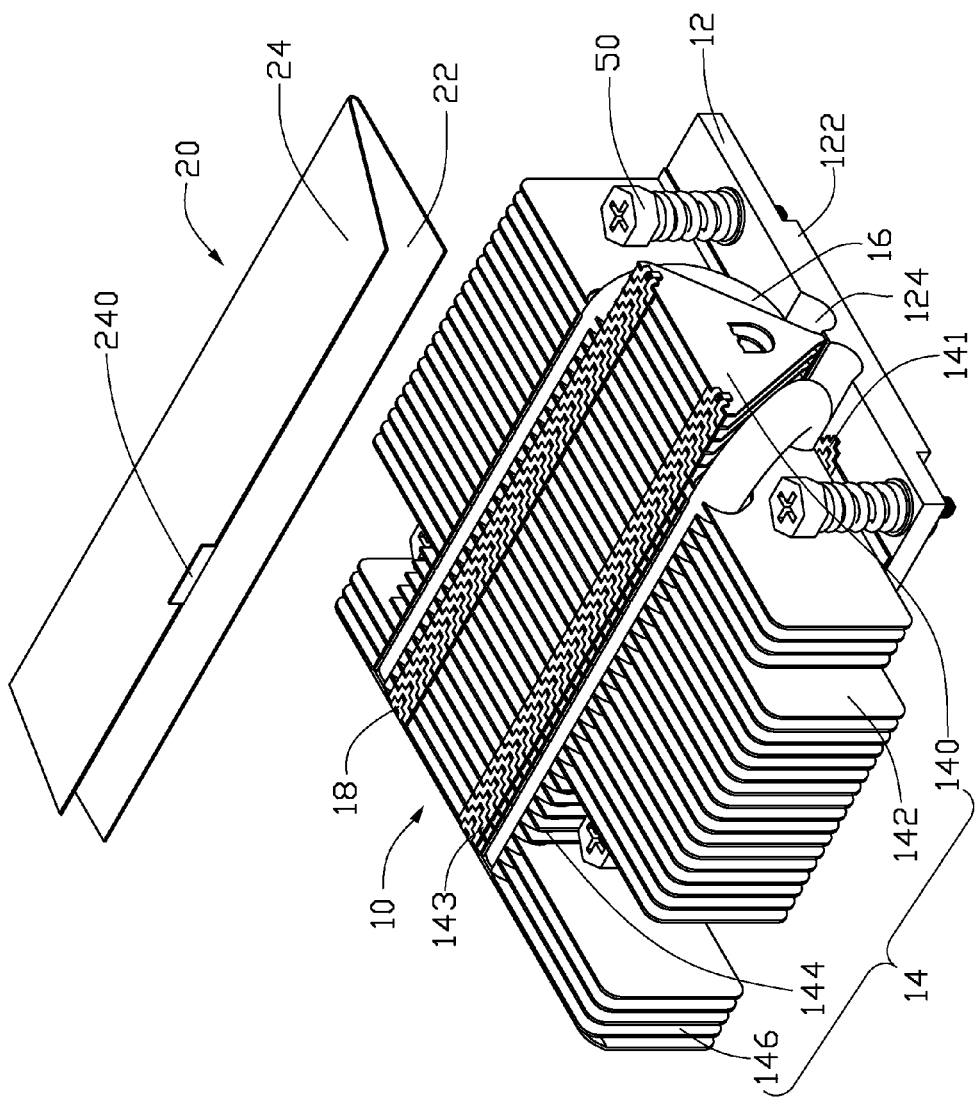
FIG. 2 is an exploded view of FIG. 1.

As shown in FIG. 2, the heat sink 10 comprises a base 12, a plurality of fins 14 arranged on the base 12, a pair of heat pipes 16 extending through the fins 14 and soldered on the base 12. The base 12 comprises a rectangular plate (not labeled) and a rectangular protrusion 122 projecting downwardly and vertically from a bottom face of the plate. A bottom face of the protrusion 122 is for contacting the graphic card to absorb heat generated by the graphic card. The plate has an area larger than that of the protrusion 122 for conducting the heat absorbed by the protrusion 122 from the graphic card to the fins 14 evenly. A pair of parallel grooves 124 are defined at a top face of the plate. Four screws 50 extend through the plate and threadedly engage with the graphic card to secure the heat sink 10 on the graphic card. The plurality of fins 14 are spaced equidistantly from each other with passages (not labeled) defined therebetween for allowing the airflow generated by the fan 40 to flow through the plurality of fins 14. Due to the four screws 50 occupying different locations of the base 12, accordingly, the plurality of fins 14 located at different positions of the base 12 have fins 140, 142, 144, 146 with different configurations: the fins 140 each have a smallest area and a triangular configuration and are located at a front area of the base 12 between two front screws 50; the fins 142 each have a rectangular shape and an area larger than that of each of the fins 140 and are located in a central area of the base 12 and between the two front screws 50 and two rear screws 50; the fins 144 each have a rectangular shape and an area between that of each of the fins 140 and that of each of the fins 142 and are located between the two rear screws 50; and the fins 146 each have a rectangular configuration and an area similar to that of each of the fins 142 and are located at a rear area of the base 12 behind the two rear screws 50. Each of the plurality of fins 14 has a lower flange 141 bent perpendicularly from a bottom edge thereof and a pair of upper flanges 143 bent vertically from a top edge thereof. The pair of upper flanges 143 of each of the plurality of fins 14 are locked with the pair of upper flanges 443 of an adjacent one of the plurality of fins 14 to define two elongated, planar beams 18, thus connecting the plurality of fins 14 together. The lower flanges 141 of the plurality of fins 14 connect with each other and are soldered on the top face of the plate so that the fins 14 and the plate are mechanically and thermally connected together. A pair of cutouts (not labeled) are defined at a bottom portion of each of the fins 142, 144, 146 corresponding to the pair of grooves 124 of the base 12, wherein corresponding cutouts and each of the pair of grooves 124 cooperatively enclose a cylindrical passage therebetween for receiving a part of each of the pair of heat pipes 16 therein. A pair of recesses (not labeled) are defined at a top portion of each of the fins 142, 144, 146 and at two sides of the pair of upper flanges 143. The recesses at the two sides of the pair of upper flanges 143 cooperatively define two passages for receiving parts of the pair of heat pipes 16 therein. A distance between the pair of recesses is longer than that between the pair of cutouts so that the heat can be distributed over the plurality of fins 14 more evenly. The two heat pipes 16 define an acute angle therebetween. Each heat pipe 16 has a U-shaped configuration and comprises two parallel, straight portions respectively employed as an evaporating section (not labeled) and a condensing section (not labeled), and an arced portions connecting the two parallel, straight portions. The arced portions each function as an adiabatic section (not labeled) for a corresponding heat pipe 16. The pair of heat pipes 16 are attached to the plurality of fins 14 and slantwise in respect to the base 12. The evaporating section of each heat pipe 16 is accommodated in the passage at the bottom portions of the plurality of fins 14; the condensing section of each heat pipe 16 is received in the another passage at the top portions of the plurality of fins 14; and the adiabatic section of each heat pipe 16 confronts the plurality of fins 14 in such a manner that the adiabatic sections of the pair of heat pipes 16 sandwich the fins 140 therebetween.

The fan duct 20 is made by bending a planar metal plate. The fan duct 20 comprises a horizontally, rectangular first portion 22 and a rectangular second portion 24 extending slantwise and upwardly from a lateral edge of the first portion 22. A tab 240 is formed upwardly from an edge of the second portion 24 for facilitating an operation of the fan duct 20. The fan duct 20 is fixed on the top portions of the fins 14 by soldering the first portion 22 of the fan duct 20 with the two beams 18 of the fins 14 along a lengthwise direction of the beams 18, whereby the second portion 24 of the fan duct 20 defines an acute angle with the beams 18 of the fins 14.

Referring to FIG. 3, in use, the heat generated by the graphic card is conveyed to the heat sink 10. As a rotation of an impeller (not shown) of the fan 40, the airflow is engendered from the fan 40 towards the heat sink 10. A lower part of the airflow flows through the fins 14 of the heat sink 10, thereby cooling the graphic card. An upper part of the airflow passes above the heat sink 10 and is guided upwardly and slantwise by the second portion 24 along a widthwise direction of the second portion 24 of the fan duct 20, and then flows below the hard disk driver 30, thereby to cool the hard disk driver 30. Therefore, the airflow not only takes the heat from the graphic card by the heat sink 10, but also removes the heat from the hard disk driver 30 by the fan duct 20.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipating assembly adapted for dissipating heat generated by a plurality of electronic devices, the heat dissipating assembly comprising:

a heat sink having a bottom portion adapted for absorbing the heat from one of the plurality of electronic devices, the heat sink adapted for being located near a fan; and a fan duct being mounted on the heat sink, comprising a first plate fixed on a top portion of the heat sink, and a second plate extending slantwise and upwardly from the first plate, wherein when the fan is in operation, a lower part of an airflow produced by the fan flows through the heat sink to remove the heat in the heat sink from the one of the plurality of electronic devices, and an upper part of the airflow is guided upwardly and slantwise by the fan duct to flow below another one of the plurality of electronic devices, thus cooling the another one of the plurality of electronic devices;

wherein the heat sink comprises a base for contacting the one of the plurality of electronic devices, and a plurality of fins extending upwardly from the base; and wherein a pair of flanges extend horizontally from two sides of the top portion of the each of the plurality of fins, the pair of flanges of the each of the plurality of fins engaging with another pair of flanges of an adjacent one of the plurality of fins to form two elongate beams.

2. The heat dissipating assembly as described in claim 1, wherein the plurality of fins comprises first fins located on a front area of the base, each of the first fins having a triangular configuration.

3. The heat dissipating assembly as described in claim 2, wherein the plurality of fins comprises second fins located on a central area of the base, each of the second fins having a rectangular configuration and an area larger than that of the each of the first fins.

4. The heat dissipating assembly as described in claim 3, wherein the plurality of fins comprises third fins located behind the second fins, each of the third fins having a rectangular configuration and an area between that of the each of the first fins and that of the each of the second fins.

5. The heat dissipating assembly as described in claim 4, wherein the plurality of fins comprises forth fins located on a rear area of the base, each of the forth fins having a rectangular configuration and an area similar to that of the each of the second fins.

6. The heat dissipating assembly as described in claim 2, wherein the heat sink further comprises a pair of heat pipes extending therethrough, the pair of heat pipes defining an acute angle therebetween.

7. The heat dissipating assembly as described in claim 6, wherein each of the pair of heat pipes comprises a straight evaporating section sandwiched between the base and bottom portions of the plurality of fins except the first fins, a straight condensing section through top portions of the plurality of fins except the first fins, and an arced adiabatic section interconnecting the evaporating section and the condensing section, the adiabatic sections of the pair of heat pipes sandwiching the first fins therebetween.

8. The heat dissipating assembly as described in claim 1, wherein the first plate of the fan duct is fixed on the two beams along a lengthwise direction of each of the two beams.

9. The heat dissipating assembly as described in claim 1, wherein the first plate and the second plate define an acute angle therebetween for guiding the airflow slantwise and upwardly along a widthwise direction of the second plate.

10. An electronic device assembly comprising:

an electronic device;

another electronic device located above the electronic device;

a heat sink mounted on the electronic device;

a folded plate fixed on the heat sink; and a fan located near the heat sink, wherein when the fan is in operation, a part of an airflow generated by the fan flows through the heat sink, another part of the airflow is led slantwise and upwardly by the folded plate to flow below the another electronic device;

wherein the folded plate comprises a first portion secured on the heat sink, and a second portion bent slantwise and upwardly from the first portion;

wherein the heat sink comprises a base for contacting the electronic device, and a plurality of fins extending upwardly from the base, the first portion of the folded plate being fixed on top portions of the fins; and wherein each of the plurality of fins of the heat sink has two flanges formed horizontally on two sides of the top portion thereof, the first portion of the folded plate being fixed on the flanges of the plurality of fins of the heat sink.

11. The electronic device assembly as claimed in claim 10, wherein the second portion defines an acute angle with the first portion of the folded plate, the another part of the airflow being guiding by the folded plate along a widthwise of the second portion to flow through the another electronic device.

* * * * *